United States Patent [19]

Powell

[11] 3,889,287

[45] June 10, 1975

[54] MNOS MEMORY MATRIX

[75] Inventor: Michael W. Powell, Mesa, Ariz.

[73] Assignee: Motorola, Inc., Chicago, Ill.

[22] Filed: Dec. 6, 1973

[21] Appl. No.: 422,377

[52] U.S. Cl. ...................... 357/23; 357/50; 357/24; 340/173

[51] Int. Cl. ........................ H01l 11/00; H01l 15/00

[58] Field of Search ................. 317/235, 21.1, 22.2; 340/173

[56] References Cited

UNITED STATES PATENTS

| | | | |
|---|---|---|---|
| 3,653,002 | 3/1972 | Goffee | 317/235 F |
| 3,747,200 | 7/1973 | Rutledge | 317/235 F |

OTHER PUBLICATIONS

Compon. Technol. "MNOS a New Non-Volatile Store," by Oakley, Vol. 4, No. 5, Oct. 1970.

IBM Technical Disclosure Bulletin, by Krick, Vol. 15, No. 2, July 1972, pages 466 & 467.

IBM Technical Disclosure Bulletin, by Terman, Vol. 15, No. 4, Sept. 1972, pages 1227–1229.

*Primary Examiner*—Andrew J. James
*Attorney, Agent, or Firm*—Vincent J. Rauner; Henry T. Olsen

[57] ABSTRACT

A semiconductor memory of a matrix of active devices each of which is metal-nitride-oxide-silicon (MNOS) field effect transistor device. Each of the active devices defines one bit of the memory. A polycrystalline silicon member defines the gate electrode for the active device and also the row conductor for the matrix. The source and drain electrodes of columns of the field effect transistors are interconnected in parallel with other source and drain electrodes of single crystal silicon of the field effect devices to define column conductors for the matrix.

The matrix is manufactured by providing an insulating substrate having a layer of monocrystalline silicon thereon. The monocrystalline silicon is suitably masked and etched to define a plurality of parallel ladder-like structures wherein the side pieces of the ladder form the column conductors for the matrix while the cross pieces or the rungs of the ladder define the channel of the device. The shaped monocrystalline silicon material and the exposed substrate is then covered by a layer of silicon dioxide, a layer of silicon nitride and a layer of polycrystalline silicon utilizing suitable masking and etching steps. The polycrystalline silicon, the silicon-nitride and silicon-dioxide are removed to form the row conductors and gate electrodes for the active devices, while exposing portions of the side pieces of the ladders of semiconductor material. A single diffusion step is then required to create the source and drain junctions for the active devices; render conductive the column conductors; and render conductive the gate electrode and row conductors formed by the polycrystalline silicon, that portion of the monocrystalline silicon on the substrate underlying the gate electrode being masked by the gate electrode so as to define the channel in the originally deposited rung of the monocrystalline silicon.

4 Claims, 9 Drawing Figures

MNOS MEMORY MATRIX

BACKGROUND OF THE INVENTION

This invention relates to semiconductor memories and more particularly to a semiconductor memory of the single active device type referred to as a metal-nitride-oxide-semiconductor memory.

A metal-nitride-oxide-silicon (MNOS) transistor is a field effect transistor having an insulated gate formed by a nitride and oxide layer. A detailed description of the characteristics of thick oxide MNOS transistor is found in "The Metal-Nitride-Oxide-Silicon (MNOS) Transistor — Characteristics and Applications," Dov Forhman-Dentchkowsky, Proceedings of the IEEE, Vol. 58, No. 8, August, 1970, page 1,207.

It has been previously further suggested that a single MNOS transistor may form a single-active-device-per-bit memory which achieves bistable logic states from flat band shifts due to charge storage at the silicon dioxide/silicon nitride interface during polarization pulses. The memory contains two columns sense lines for the transistor source and drain respectively and one row address line for the transistor gate. In a well-known metal gate MNOS technology, the memory cell utilizes a metal row address line thereby eliminating ohmic contacts from the row line to the transistor gates. However, in the metal gate technology, self-alignment between the metal gate electrode and the source and drain region is not achievable and gate/drain overlap tolerances must be incorporated into the device. Such tolerances increase the size of the memory cell and degrade its performance due to the presence of the overlap capacitances. Self-aligned field effect transistor devices have been achieved in the art by utilizing polycrystalline silicon gate electrodes which are doped at the same time that the source and drain regions are diffused providing self-aligned structures. However, such prior art self-aligned gate technology still required contact from the polycrystalline source or drain to the metal column address line, hence, the required area per cell was still relatively large.

The invention solves the aforementioned problems of prior art MNOS devices by providing a method of producing such devices on insulating substrates wherein columns of semiconductor material are electrically continuous and wherein silicon gate MNOS transistors may be used as a nonvolatile memory element without requiring ohmic contacts thereto at each memory cell location.

SUMMARY OF THE INVENTION

It is an object of this invention to provide an improved monolithic semiconductor memory and method of making the same.

It is a further object of this invention to provide an improved relatively nonvolatile electrically alterable high density memory array wherein self-aligned devices are provided without the necessity of providing ohmic contacts at each such memory cell and method of making such an array.

Briefly described, the invention provides a monolithic array of nonvolatile self-aligned electrically alterable memory devices. A plurality of spaced parallel, lightly doped silicon structures are provided on an insulating substrate, each of the structures having therein a plurality of spaced lines and openings exposing the insulating substrate defining parallel ladder-like structures. Rows of composite dielectric layers which may be silicon oxide, silicon nitride and polycrystalline silicon are provided on aligned silicon regions, each row extending across a corresponding pair of said openings overlying the rungs of the ladder structures. The exposed regions of silicon are heavily doped by diffusing impurities therein, said composite dielectric regions and the polycrystalline silicon acting as a mask for the covered monocrystalline material. Thus, the side pieces and the rungs of the ladder become the column conductors and channel, respectively, for the MNOS devices.

THE DRAWINGS

Further objects and advantages of the invention will be understood from the following complete description thereof and from the drawings wherein.

COMPLETE DESCRIPTION

The invention and a preferred embodiment thereof provides a high density array of electrically alterable MNOS memory elements. Such memory elements may be used as a resettable ROM (read only memory) or as a RAM (random access memory). In a metal-nitride-oxide-silicon transistor, a charge is stored at the nitride oxide interface varying the threshold voltage of the device. This threshold voltage variance can be used as a memory storage device, either in the ROM or RAM sense, thus leading to a single-active-device-per-bit type of semiconductor memory.

Figure 1:
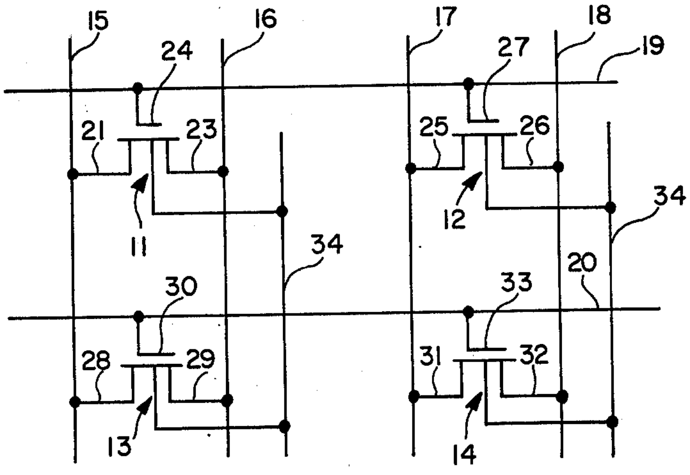
FIG. 1 is a circuit schematic of a portion of the memory matrix.

Referring now to FIG. 1, there is shown a circuit schematic of a portion of a single active device type memory matrix which includes as shown for MNOS transistors 11, 12, 13 and 14 connected by column conductors 15, 16, 17 and 18 respectively and row conductors 19 and 20.

The transistor 11 has a source electrode 21 connected to column line 15, a drain electrode 22 connected to column line 16 and a gate electrode 24 connected to row line 19. Similarly, transistor 12 has source electrode 25, drain electrode 26 and gate electrode 27 connected to column lines 17 and 18 and row line 19 respectively. Also, transistor 13 has source electrode 28, drain electrode 29 and gate electrode 30 connected to column lines 15 and 16 and row line 20 respectively; and transistor 14 has source electrode 31, drain electrode 32 and gate electrode 33 connected to column lines 17 and 18 and row line 20 respectively. The array may have a back gate connection 34, normally at ground.

Figure 2:
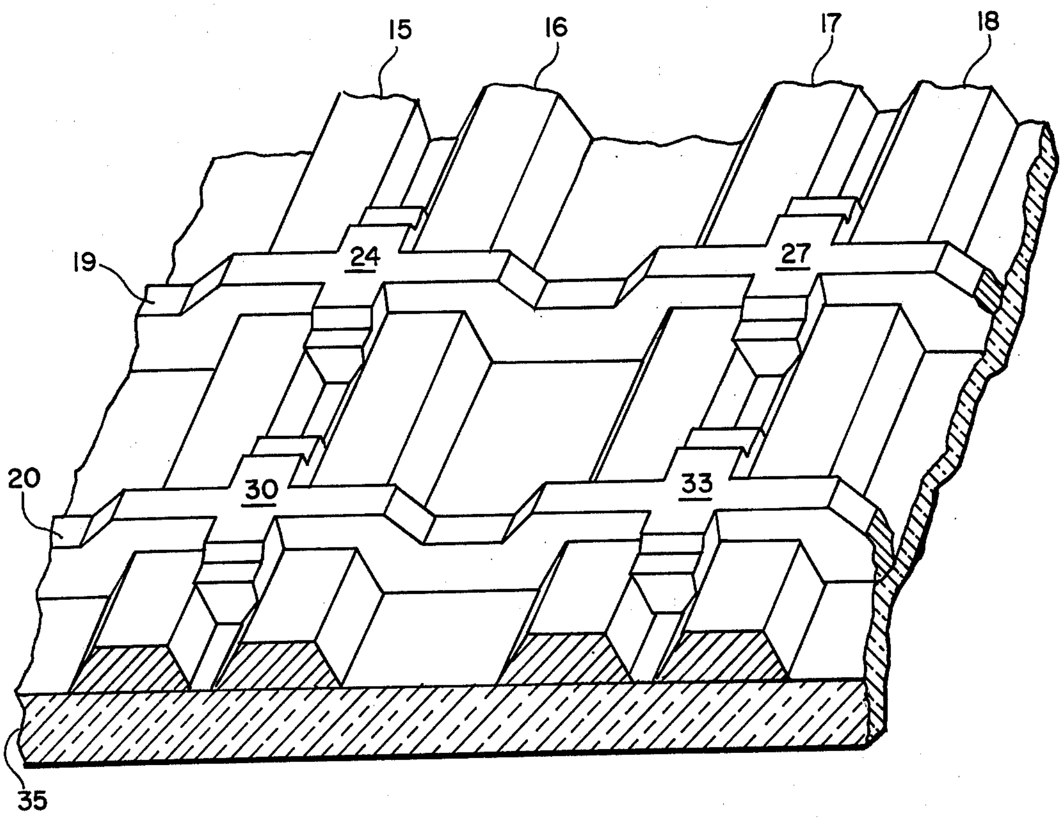
FIG. 2 is a perspective view of a portion of the monolithic semiconductor memory matrix.
Figure 3:
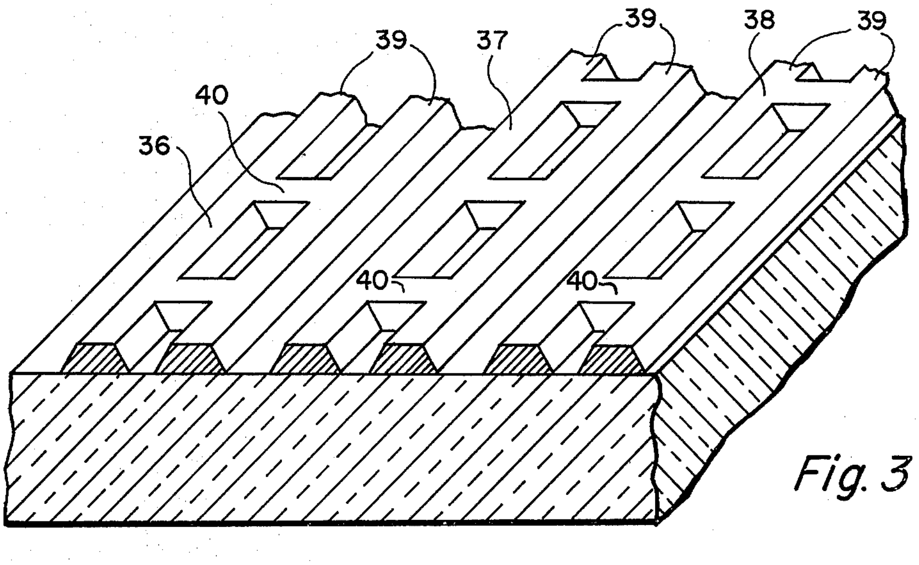
FIG. 3 is a perspective view thereof at an early stage in its manufacture.

The physical implementation of the above portion of the semiconductor matrix is shown somewhat schematically in the perspective view FIG. 2, with like numbers of FIG. 1 being utilized to indicate the respective column and row lines together with the gate areas of the transistor all constructed integrally on an insulating substrate 35 of sapphire or spinel. Thus, the column lines 15 to 18 are of doped monocrystalline silicon and the row conductors overlie and are insulated from the column lines while simultaneously forming the gate areas 24, 27, 30 and 33. The row lines and the gate electrodes are of polycrystalline silicon, as shall be explained in further detail hereinafter. While only a certain portion of the matrix is shown in the schematic and in FIG. 2, it will be understood that the same general format may be utilized in developing, for example, a 5 × 4 matrix giving a 20 bit memory.

The ends of the column lines and the ends of the row lines are driven by the row and column decoders of silicon gate processed MOS devices also on the substrate.

The memory structure will be better understood from FIGS. 3 to 9 which describe the device in accordance with its successive stages manufactured thereby more clearly depicting the layered structure forming the matrix of MNOS transistors. With reference to this manufacture, there is provided a starting substrate 35 of sapphire or spinel on which is deposited a monocrystalline layer of silicon. The monocrystalline layer of silicon approximately 1 micron in thickness is masked and etched to provide a series of parallel ladders 36, 37 and 38 (FIG. 3), each having side rails 39 and cross pieces or rungs 40. The side rails 39 of the ladder structure will ultimately form the column conductors of the memory device with the channel of the individual transistors formed in the rungs 40 thereof.

Figure 4:
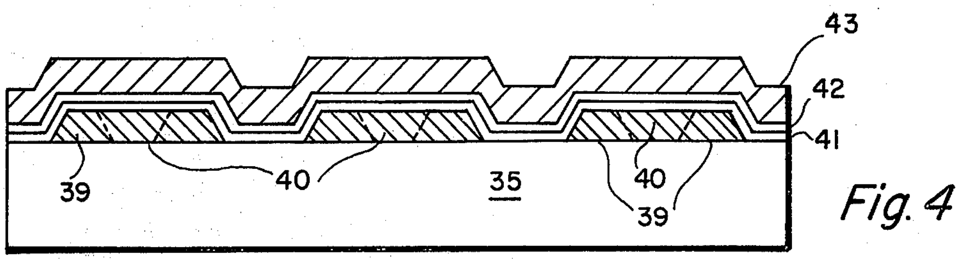
FIGS. 4 to 6 are cross sections taken along lines 4—4, 5—5 and 6—6 respectively of FIG. 7.
Figure 5:
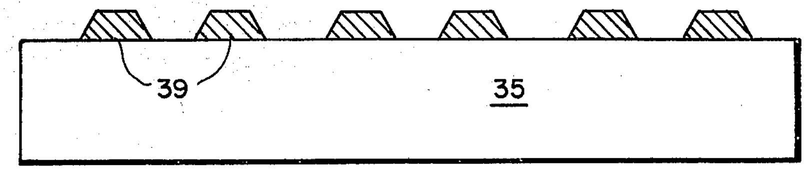
Figure 6:
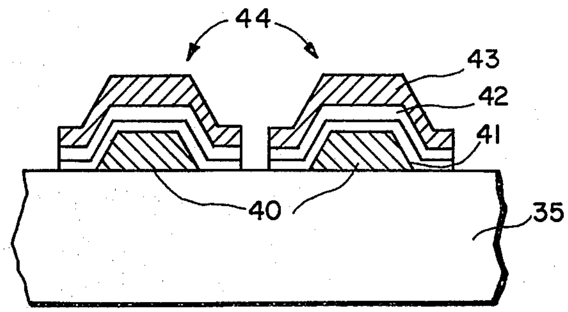
Figure 7:
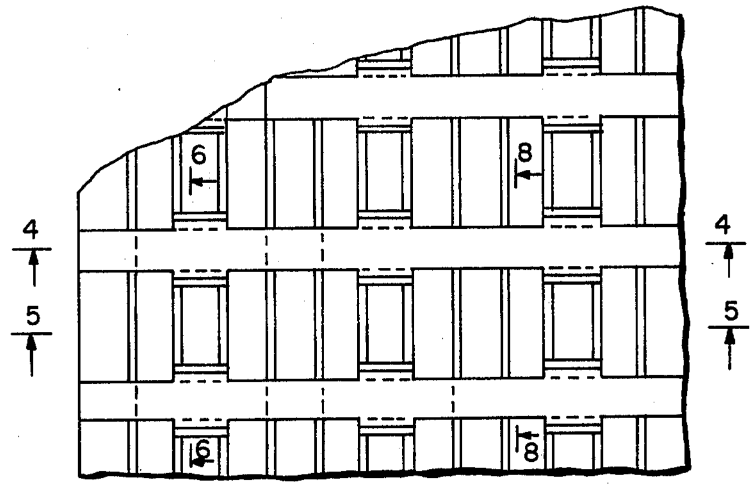
FIG. 7 is a plan view thereof at a successive stage in the manufacture.
Figure 8:
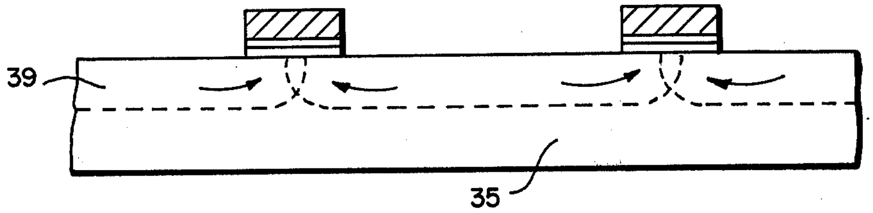
FIG. 8 is a cross section at a succeeding stage in the manufacture.
Figure 9:
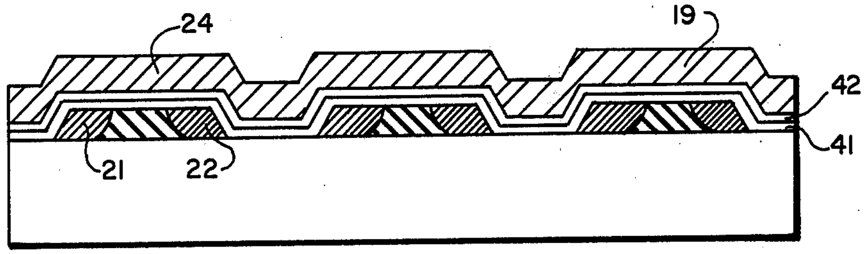
FIG. 9 is a cross section similar to FIG. 4 at a succeeding stage in the manufacture of the semiconductor memory.

Following the patterning of the monocrystalline silicon into the ladders, a thin layer 41 of silicon dioxide (50–200 Angstroms), a layer 42 of silicon nitride (300–1000 Angstroms) and a relatively thick layer 43 of polycrystalline silicon (approximately 10,000 Angstroms) is deposited over the entire surface of the dielectric substrate 35 and the ladder structures 36 to 38 (FIG. 4). Suitable photolithographic techniques are then utilized to form the polycrystalline silicon layer 43, the silicon nitride layer 42 and the silicon dioxide layer 41 resulting into strips 44 (FIG. 6) which extend from side to side of the device and overlie the rungs 40 of the ladders of monocrystalline silicon. Sections 45 (FIG. 7), which are cross-shaped in plan view, are patterned into the overlying layer so that the silicon dioxide, silicon nitride and polycrystalline silicon will still surround the sides of the rungs 40 (FIG. 6). This patterning results in exposure of the surfaces of the side rails 39 (FIG. 5) of monocrystalline silicon while masking the rungs 40 (FIG. 6). A standard diffusion step is then performed. This diffusion step increases the conductivity of the polycrystalline silicon layer 43 and converts the conductivity of the monocrystalline silicon layer 39 which is exposed. The row width over the column is approximately 5 microns. The junction depth of the diffusion is much greater than 1 micron and the out-diffusion under the row converts the conductivity even though the row is masking as it does for the gate. Thus, the doped side rails 39 become the column conductors 15, 16, etc., (FIG. 8) and the polycrystalline strips 44 become the row conductors 19 and simultaneously a gate electrode such as gate electrode 24 (FIG. 9). The diffusion is carried on a sufficient time, the 1 micron epitaxial on the sapphire makes this time shorter than for a conventional substrate, so that the dopant diffuses into the portion of the side rails 39 underlying the masking layers so that junctions are formed at the ends of the rungs 40. These junctions thereby define source and drain electrodes such as electrodes 21 and 22. A channel being defined therebetween underlying the gate area 24 underlying the conductor.

It will thus be seen that there is divided a single-active-device-per-bit semiconductor memory wherein each bit is defined by a single metal nitride oxide field effect transistor device of either P or N-channel type and also an economic process for making the same. While the invention has been disclosed by way of the particular preferred embodiment thereof, it should be noted that suitable modifications and improvements may be made therein without departing from the spirit and scope of the invention.

In the event a back gate connection is desired, the monocrystalline material between the ladder rungs need not be removed as by the foregoing process. Then a separate masking is required to maintain the diffusions in the necessary regions. A field oxide may be used as in the standard silicon gate process.

What is claimed is:

1. A monolithic array of memory devices comprising a plurality of spaced parallel silicon structures on an insulating substrate, each of said structures having therein a plurality of spaced openings therein exposing the insulating substrate and thereby defining a plurality of parallel ladder-like structures having side pieces and rungs, rows of composite dielectric layers overlying aligned silicon regions, each row extending across a corresponding pair of openings and overlying the rungs and portions of the side pieces of the ladder structures, the side pieces of the ladder-like structures forming column conductors for the memory device and the rungs forming channels for the active device.

2. A monolithic array as recited in claim 1 wherein said composite dielectric layer comprises layers of silicon oxide, silicon nitride and polycrystalline silicon respectively.

3. A monolithic array as recited in claim 2 wherein said insulating substrate is of sapphire or spinel.

4. A monolithic array as recited in claim 1 wherein the row width over the side pieces is such that out-diffusion makes the side pieces conductive and provides devices source and drain even though the row is masking portions of said side pieces.

* * * * *